United States Patent
Ikonen

(10) Patent No.: US 12,323,147 B2
(45) Date of Patent: Jun. 3, 2025

(54) SINGLE-POLE DOUBLE-THROW RADIO-FREQUENCY SWITCH TOPOLOGY

(71) Applicant: SAAB AB, Linköping (SE)

(72) Inventor: Petri Ikonen, Kuhmalahti (FI)

(73) Assignee: SAAB AB, Linköping (SE)

( * ) Notice: Subject to any disclaimer, the term of this patent is extended or adjusted under 35 U.S.C. 154(b) by 173 days.

(21) Appl. No.: 18/256,953

(22) PCT Filed: Dec. 15, 2021

(86) PCT No.: PCT/SE2021/051258
§ 371 (c)(1),
(2) Date: Jun. 12, 2023

(87) PCT Pub. No.: WO2022/132010
PCT Pub. Date: Jun. 23, 2022

(65) Prior Publication Data
US 2024/0106417 A1    Mar. 28, 2024

(30) Foreign Application Priority Data
Dec. 16, 2020 (FI) .................................. 20206317

(51) Int. Cl.
*H03K 3/01* (2006.01)
*H03K 17/56* (2006.01)

(52) U.S. Cl.
CPC .............. *H03K 3/01* (2013.01); *H03K 17/56* (2013.01)

(58) Field of Classification Search
CPC ............. H03K 17/56; H03K 3/01; H01P 1/15
See application file for complete search history.

(56) References Cited

U.S. PATENT DOCUMENTS 3,538,465 A    11/1970   Manning, Jr. et al.
6,288,620 B1 *  9/2001   Atokawa ................. H04B 1/52
                                                          333/126

(Continued)

FOREIGN PATENT DOCUMENTS

EP    1796203 A1    6/2007
SU    1587603 A1    8/1990

OTHER PUBLICATIONS

Katzin, P. et al.; "High-Speed, 100 + w RF Switches Using GAAS MMICS"; IEEE Transactions On Microwave Theory and Techniques, vol. 40, No. 11; Nov. 1, 1992; pp. 1989-1996 (8 pages).

(Continued)

*Primary Examiner* — Quan Tra
(74) *Attorney, Agent, or Firm* — Sage Patent Group

(57) ABSTRACT

The present disclosure relates to a single pole double throw, SPDT, radio frequency, RF, switch topology including a first port, a second port, and a third port. A first switchable path is arranged between the first port and the second port and includes at least one first switching stage and at least one second switching stage. A second switchable path is arranged between the first port and the third port and includes at least one first switching stage and at least one second switching stage. Each first switching stage includes a first impedance network having a line inductance element and two shunt capacitors, the first switching stage further including at least one shunt PIN diode and a bias feed for applying a bias voltage to the at least one shunt PIN diode, wherein the two shunt capacitors of each first switching stage are grounded via the at least one shunt PIN diode.

11 Claims, 10 Drawing Sheets

(56) References Cited

U.S. PATENT DOCUMENTS

| | | | | |
|---|---|---|---|---|
| 6,414,566 B1* | 7/2002 | Atokawa | ................ | H01P 1/213 |
| | | | | 333/103 |
| 6,525,626 B2* | 2/2003 | Mandai | ................ | H01P 1/2135 |
| | | | | 333/133 |
| 7,659,794 B2* | 2/2010 | Tsai | ........................ | H01P 1/15 |
| | | | | 333/262 |
| 2004/0174869 A1 | 9/2004 | Sone et al. | | |
| 2007/0171000 A1 | 7/2007 | Tsukahara | | |
| 2010/0253445 A1* | 10/2010 | Ando | ...................... | H03J 5/244 |
| | | | | 333/101 |
| 2015/0054594 A1 | 2/2015 | Apriyana et al. | | |
| 2015/0318890 A1* | 11/2015 | Uejima | ................ | H03H 7/0115 |
| | | | | 455/83 |
| 2023/0353187 A1* | 11/2023 | ud Din | ................ | H04B 1/0053 |

OTHER PUBLICATIONS

International Search Report and Written Opinion mailed Mar. 23, 2022 for International Application No. PCT/SE2021/051258, 18 pages.

Office Action and Search Report mailed Jun. 24, 2021 for Finnish U.S. Appl. No. 20/206,317, 6 pages.

International Preliminary Report on Patentability (IPRP) mailed Jan. 26, 2023 for International Application No. PCT/SE2021/051258, 10 pages.

* cited by examiner

SINGLE-POLE DOUBLE-THROW RADIO-FREQUENCY SWITCH TOPOLOGY

CROSS-REFERENCE TO RELATED APPLICATIONS

This application is a 35 U.S.C § 371 national stage application for International Application No. PCT/SE2021/051258, entitled "A SINGLE-POLE DOUBLE-THROW RADIO-FREQUENCY SWITCH TOPOLOGY", filed on Dec. 15, 2021, which claims priority to Finnish Patent Application No. 20206317, filed on Dec. 16, 2020, the disclosures and contents of which are hereby incorporated by reference in their entireties.

TECHNICAL FIELD

The present disclosure relates to a single-pole double-throw radio-frequency switch topology and a radio-frequency system.

BACKGROUND ART

Switches are electrical components which are configured to make or break electrical circuits automatically or manually. Conventionally, switches works with an ON and OFF mechanism and are often utilized in radio-frequency (RF) systems for routing microwave power.

Numerous circuits hold switches that control how the circuit works so to actuate difference characteristics of the circuit. There is a variety of different types of switches, the classification of switches depends on the connection the switches are configured to make.

Two vital components that confirm the sorts of connections a switch makes are the pole and the throw of a switch. The amount of circuits controlled by the switch is indicated by the poles. Further, the number of throws indicates how many different connections every switch pole can connect.

The most common type of switches are single-pole single-throw (SPST), single-pole double-throw (SPDT), double-pole single-throw (DPST) and double-pole double throw DPDT switches. A SPDT switch is a three terminal switch, which connects a common terminal to one of the other of two terminals. Thus, two circuits/paths are controlled via one way or source.

SPDT switches in the present art offer either wide bandwidth or high power. There are no switches in the present art that offer both. A SPDT switch that incorporate wide bandwidth combined with a high power will allow e.g. an antenna to operate with a wide frequency range while being able to operate with an increased signal strength and a narrow beam leading to an increased overall performance of the antenna which further allows for applicability in several modern applications.

Thus, there is room for SPDT switch topologies in the present art to explore the domain of providing a SPDT switch topology that offers high power and wide bandwidth compared to previous solutions. There is specifically a need in the present art for improving SPDT switch topologies so to be able to provide a high power and wide bandwidth. Accordingly, there is room for improvements in the art to provide means for such switch topologies.

Even though some currently known solutions work well in some situations it would be desirable to provide a SPDT switch topology that fulfils requirements related to improving the bandwidth and power of the same.

SUMMARY

It is therefore an object of the present disclosure to provide a SPDT switch topology and a RF system to mitigate, alleviate or eliminate one or more of the above-identified deficiencies and disadvantages.

This object is achieved by means of a SPDT switch topology and an RF system as defined in the appended claims.

In accordance with the disclosure there is provided a SPDT switch topology according to claim 1 and a RF system according to claim 11.

The present disclosure provides s single-pole double-throw (SPDT) radio-frequency (RF) switch topology comprising a first port, a second port, and a third port. The SPDT RF switch topology further comprises a first switchable path arranged between the first port and the second port and a second switchable path arranged between the first port and the third port. The first switchable path comprises at least one first switching stage and at least one second switching stage. The second switchable path comprises at least one first switching stage and at least one second switching stage. In some embodiments, the second switching stage is a special case of the first switching stage, wherein at least one capacitor is removed or has small or null value compared to the first switching stage.

Moreover, each first switching stage comprises a first impedance network having a line inductance element (e.g. a line inductor) and two shunt capacitors, the first switching stage further comprises at least one shunt PIN diode and a bias feed for applying a bias voltage to the at least one shunt PIN diode. The two shunt capacitors of each first switching stage are grounded via the at least one shunt PIN diode. Furthermore, each second switching stage comprises a second impedance network having a line inductance element and a shunt capacitor, the second switching stage further comprising at least one shunt PIN diode and a bias feed for applying a bias voltage to the at least one shunt PIN diode, wherein the shunt capacitor of each second switching stage is grounded via the at least one shunt PIN diode.

The switch topology further comprises control circuitry configured to control the bias feed of each first switching stage and each second switching stage so to selectively alternate the first and the second switchable paths between a first operating mode and a second operating mode.

A benefit with the switch topology is that it offers a combination of high power and decade wide bandwidth (approximately 160% or more). The impedance network combined with the shunt-only PIN-diodes allows for a high power and wide bandwidth functionality of the SPDT switch.

The first operating mode may be an isolation mode, and the second operating mode may be an insertion loss mode, wherein the control circuitry is configured to control each bias feed so to form an active signal path in insertion loss mode, and an inactive signal path in isolation mode.

A benefit of this is that it allow for the switch topology to isolate inactive signal path and to minimize insertion loss in an active signal path.

The second switching stages of the first and second switchable paths are arranged closer to the second and third ports, respectively, as compared to the first switching stages of the first and second switchable paths.

A benefit of this is that an improved isolation is achieved when said second switching stages are arranged closer to the second and third port, respectively, compared to the first switching stages of each path.

The first port may be an antenna port, the second port may be a transmit port, the third port is a receive port. However, according to some embodiments, the second and third port may both be transmit ports. Further the first port, the second port, and the third port may be any suitable type of ports and are not limited to an antenna system.

A benefit of having an arrangement wherein the first port is an antenna port, the second port is a transmit port and the third port is a receive port is that it allows for the antenna to alternate between a transmit and a receive operating mode with reduced/minimal interference between the states.

Accordingly, the first switchable path may be a transmit (Tx) path and the second switchable path may be a receive (Rx) path, wherein the control circuitry is configured to selectively connect the antenna port to either the transmit port or the receive port by means of controlling each bias feed so to alternate between a transmitting operating mode and a receiving operating mode.

The first and the second switchable path may each comprises matching networks, each matching network comprising at least one shunt capacitor, and at least one line inductance element, e.g. a line inductor.

The PIN diodes of each switching state may comprise an ON-state and an OFF-state, wherein the control circuitry is configured to control the bias feed so to set the PIN diodes in the first switching stage on the first switchable path in a different state relative to the PIN diodes in the first switching stage on the second switchable path.

Moreover, the PIN diodes of each switching state comprise at least an ON-state and an OFF-state, wherein the control circuitry is configured to control the bias feed so to set the PIN diodes in the second switching stage on the first switchable path in a different state relative to the PIN diodes in the second switching stage on the second switchable path.

The alternation between ON/OFF states of the switching stages in each path allows for the switch topology to efficiently operate according to a SPDT switch while providing high power capability and wide bandwidth.

The switch topology may comprise an intermediate node, wherein the first switchable path extend in-between the first port, the intermediate node and the second port, forming a first arm in-between the second port and the intermediate node, wherein the second switchable path extend in-between the first port, the intermediate node and the third port, forming a second arm in-between the intermediate node and the third port, wherein at least one of the arms comprises a at least one first switching stages. The number for first switching stages may vary depending on a required specification of the switch i.e. bandwidth, isolation and insertion loss.

Moreover, the switch topology may be asymmetrically arranged. Thus, at least one of the number of first switching stages on the first arm relative to the second arm may be different; or the number of second switching stages on the first arm relative to the second arm may be different.

A benefit of having an asymmetrically arranged switch topology can be to enhance the performance of one of the paths in the switch topology.

There is further provided an RF system comprising the switch topology according to the present disclosure.

BRIEF DESCRIPTION OF THE DRAWINGS

In the following the invention will be described in a non-limiting way and in more detail with reference to exemplary embodiments illustrated in the enclosed drawings, in which.

DETAILED DESCRIPTION

In the following detailed description, some embodiments of the present disclosure will be described. However, it is to be understood that features of the different embodiments are exchangeable between the embodiments and may be combined in different ways, unless anything else is specifically indicated. Even though in the following description, numerous specific details are set forth to provide a more thorough understanding of the provided switch topology and RF system, it will be apparent to one skilled in the art that the switch topology and RF system may be realized without these details. In other instances, well known constructions or functions are not described in detail, so as not to obscure the present disclosure.

Figure 1:
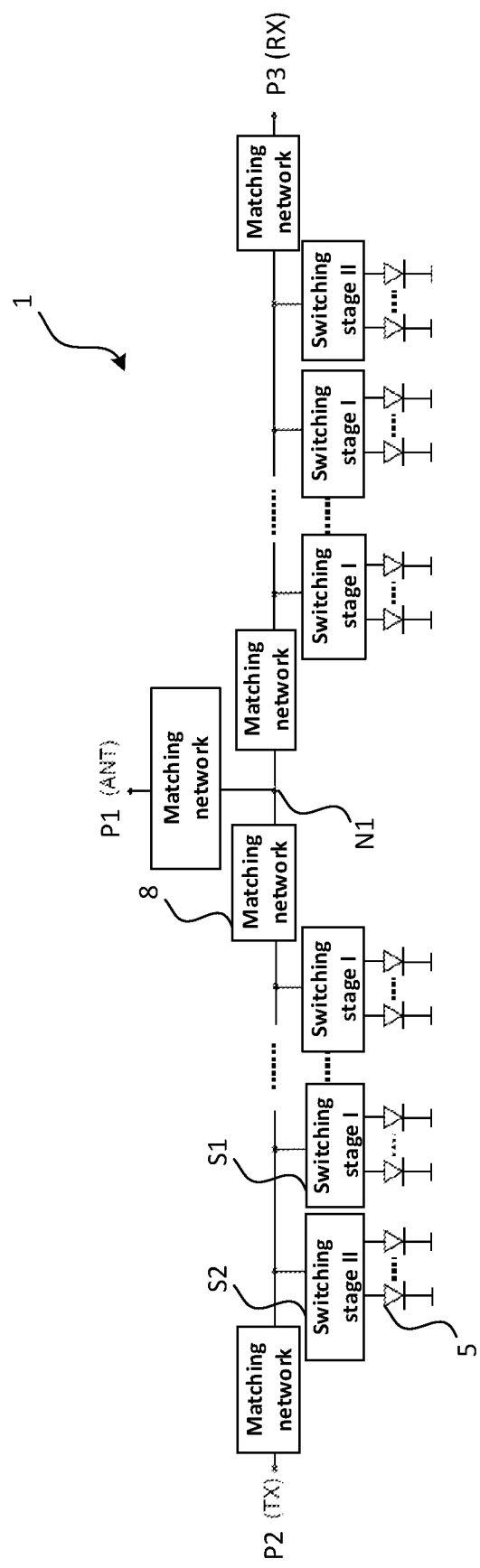
FIG. 1 illustrates a switch topology in accordance with an embodiment of the present disclosure

FIG. 1 illustrates an overview of a schematic of the switch topology 1 in accordance with an embodiment of the present disclosure. FIG. 1 shows a single-pole double-throw (SPDT) radio-frequency (RF) switch topology 1 comprising a first port P1, a second port P2, and a third port P3, a first switchable path arranged between the first port P1 and the second port P2 and a second switchable path arranged between the first port P1 and the third port P3. The first switchable path comprises at least one first switching stage S1 and at least one second switching stage S2. Further, the second switchable path comprises at least one first switching stage S1 and at least one second switching stage S2.

The SPDT switch topology 1 in accordance with FIG. 1 allows for alternation of the switching paths so to alternate between the first and the second switching paths. The switching paths may be defined by the paths to/from P2-P1, and P3-P1. The number of switching stages S1 may vary depending on the required specification of the switch, i.e. bandwidth, isolation and insertion loss. Thus, the SPDT switch 1 may have a plurality of first and second switching stages S1, S2 and isn't limited to the amount shown in FIGS. 1 and 2.

Figure 2:
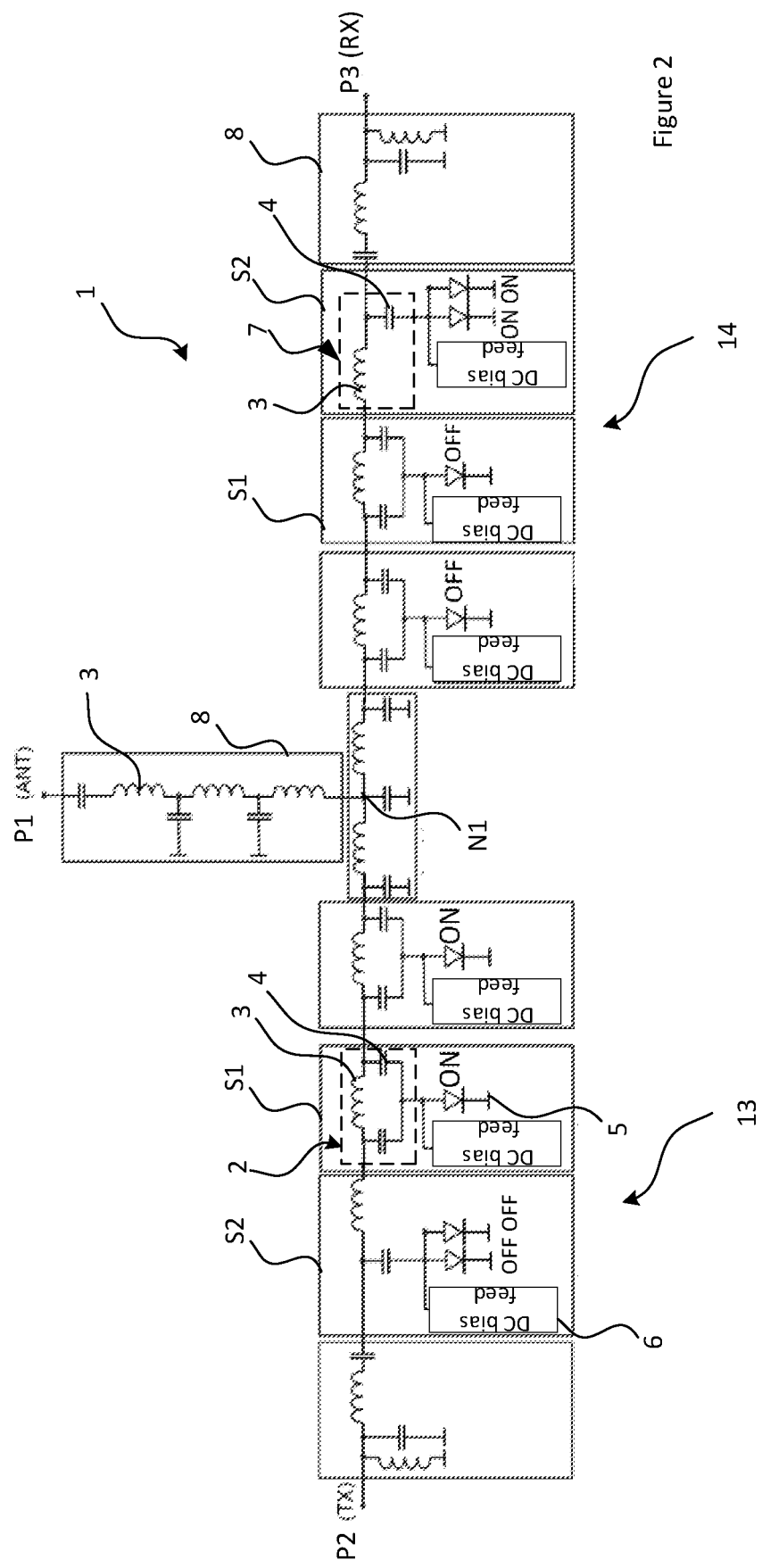
FIG. 2 illustrates a switch topology in accordance with FIG. 1 illustrating the electric scheme in more detail

FIG. 2 illustrates the SPDT switch topology 1 as shown in FIG. 1 in more detail. In FIG. 2 the circuit schemes of the first and the second switching stages S1, S2 are shown in more detail. As seen in FIG. 2, each first switching stage S1 comprises a first impedance network 2, the first impedance network comprises a line inductance element 3 and two shunt capacitors 4. Further, each first switching stage S1 also comprises at least one shunt PIN diode 5 and a bias feed 6 for applying a bias voltage to the at least one shunt PIN diode 5. Moreover, the two shunt capacitors 4 of each first switching stage S1 are grounded via the at least one shunt PIN diode 5. The impedance network scheme comprising a line inductor 3 and two shunt capacitors 4 combined with the switching stage S1, S1 configuration and the shunt only PIN diodes 5 allow for a high power combined with a wide bandwidth. It should be noted that in FIG. 2 the line inductance element is a line inductor 3, however the line inductance element 3 may be a transmission line (not shown) with appropriate width and length.

As seen in FIG. 2, the PIN diodes 5 are used only in shunt configuration (i.e. no series PIN-diodes). In FIG. 2 the cathodes of the PIN-diodes 5 are connected to the ground. This allows for a solid ground connection for the cathodes of the PIN-diodes 5 which enables excellent thermal conduction. Further, the shunt only configuration allows for handling of high power levels in said SPDT switch 1. It should be noted that in some embodiments the anode is connected to ground.

Referring to the second switching stages S2 in FIG. 2, each second switching stage S2 comprises a second impedance network 7 having a line inductor 3 and a shunt capacitor 4, the second switching stages S2 further comprises at least one shunt PIN diode 5 and a bias feed 6 for applying a bias voltage to the at least one shunt PIN diode 5, wherein the shunt capacitor 4 of each second switching stage S2 is grounded via the at least one shunt PIN diode 5.

The SPDT switch 1 further comprises control circuitry 10 (seen in FIG. 6) configured to control the bias feed 6 of each first switching stage S1 and each second switching stage S2 so to selectively alternate the first and the second switchable paths between a first operating mode and a second operating mode. In other words, the SPDT switch in accordance with the present disclosure can independently control first and second switching stages S1, S2 on each path, allowing for improved flexibility.

The first operating mode may be an isolation mode, and the second operating mode may be an insertion loss mode, wherein the control circuitry 10 is configured to control each bias feed 6 so to form an active signal path in insertion loss mode, and an inactive signal path in isolation mode. It should be noted that the SPDT switch topology 1 in FIG. 2 is set so that the first path between P2-P1 is in said second operating mode i.e. insertion loss mode. Consequently, the second path i.e. between P3-P1 is in isolation mode. The respective modes are dependent on the PIN-diode switches which may be ON/OFF.

The term "insertion loss" refers to the loss of signal when a signal is traveling in and out of a given circuit or traveling into a component and out from a component. The insertion loss is conventionally measured in decibels, dB. Accordingly, the term "insertion loss mode" refers to that the SPDT switch 1 is in a mode that is configured to minimize the insertion loss of the signal traveling in a specific path of a given circuit.

The term "isolation mode" refers to that one path in the SPDT switch 1 is in a mode that is arranged to minimize leakage/increase isolation in said path relative to the path in insertion loss mode. Accordingly, in FIG. 2, the P2-P1 path is in insertion loss mode and the P1-P3 path is in isolation mode so to not interfere or disturb the operation of the P2-P1 path. Thus, in FIG. 2 which may depict an antenna (denoted 'ANT'), the antenna may be in a transmit mode.

Hence, as shown in FIG. 2, the first port P1 may be an antenna port, the second port may be a transmit port and the third port may be a receive port. Accordingly, the first switchable path may be a transmit (Tx) path and the second switchable path may be a receive, Rx, path, wherein the control circuitry (see FIG. 6) is configured to selectively connect the antenna port to either the transmit port or the receive port by means of controlling each bias feed 6 so to alternate between a transmitting operating mode and a receiving operating mode, wherein the set mode may be referred to as an active mode. Consequently, the operating mode that is active is in insertion loss mode, wherein the operating mode that is inactive is in isolation mode.

It should however be noted, that the switch topology could have other type of ports such that e.g. the first port P1 could be called a common port and the signal may be directed to either P2 or P3, e.g. if a TX-signal is switched alternatively to one of the two ports P2, P3.

As further shown in FIGS. 1 and 2, the second switching stages S2 of the first and second switchable paths may be arranged closer to the second and third ports P2, P3, respectively, as compared to the first switching stages S1 of the first and second switchable paths. A benefit of this is that it allows for an improved isolation of respective path when in isolation mode.

As seen in FIG. 2, the PIN diodes 5 of each switching state S1, S2 may comprise an ON-state and an OFF-state, wherein the control circuitry 10 (see control circuitry in FIG. 6) is configured to control the bias feed 6 so to set the PIN diodes 5 in the first switching stage S1 on the first switchable path in a different state relative to the PIN diodes 5 in the first switching stage S1 on the second switchable path. In other words, the PIN-diodes 5 of the first switching stage S1 that is in an active path will be set to an ON-state, and the PIN-diodes 5 of the first switching state that are in an inactive path will be set to an OFF-state. This is shown in FIG. 2 where the switch topology 1 is in a transmitting mode (i.e. first path is active) and the PIN-diodes 5 in the first switching stage S1 on the first switchable path are on an ON-state (denoted 'ON' in FIG. 2), consequently, the PIN-diodes 5 in the first switching stage S1 on the second switchable path are on an OFF-state. Consequently, if the second path is active, the PIN-diodes 5 in the first switching stage S1 on the second switchable path will be set on an ON-state and the PIN-diodes 5 in the first switching stage S1 in the first switchable path will be set to an OFF state.

Moreover, the PIN diodes 5 of each switching state S1, S2 may comprise at least an ON-state and an OFF-state, wherein the control circuitry 10 is configured to control the bias feed 6 so to set the PIN diodes 5 in the second switching stage S2 on the first switchable path in a different state relative to the PIN-diodes 5 in the first switching stage S1 on the first switchable path. In other words, the PIN-diodes 5 in the second switching stage S2 that are in an active path will be set to an OFF-state in said active path. This is seen in FIG. 2 showing that the PIN-diodes 5 in first switching stage S1 in the active path (first path, P2-P1) are in an ON-state. Thus, the PIN-diodes 5 in the second switching stage S2 in the first path are in an OFF-state. Accordingly, the PIN diodes 5 in the second switching stage S2 on the second path are in an ON-state. Consequently, if the second path is active (P3-P1), the PIN diodes 5 in the second switching stage S2 in the second path will be set to an OFF-state and the PIN-diodes in the second switching state S2 in the first path will be set to an ON-state.

As shown in FIGS. 1 and 2, the switch topology 1 may comprise an intermediate node N1, wherein the first switchable path extend in-between the first port P1, the intermediate node N1 and the second port P2. FIG. 2 shows that there is formed a first arm 13 in-between the second port and the intermediate node N1, wherein the second switchable path extend in-between the first port P1, the intermediate node N1 and the third port P3, forming a second arm 14 in-between the intermediate node N1 and the third port P3, wherein at least one of the arms 13, 14 comprises at least one first switching stages S1.

The switching stages S1, S2 in the switch topology 1 as shown in FIG. 1 is not limited to the number of PIN-diodes per switching stage as shown in FIG. 2. E.g. the second switching stage S2 may comprise one PIN-diode.

Figure 3:
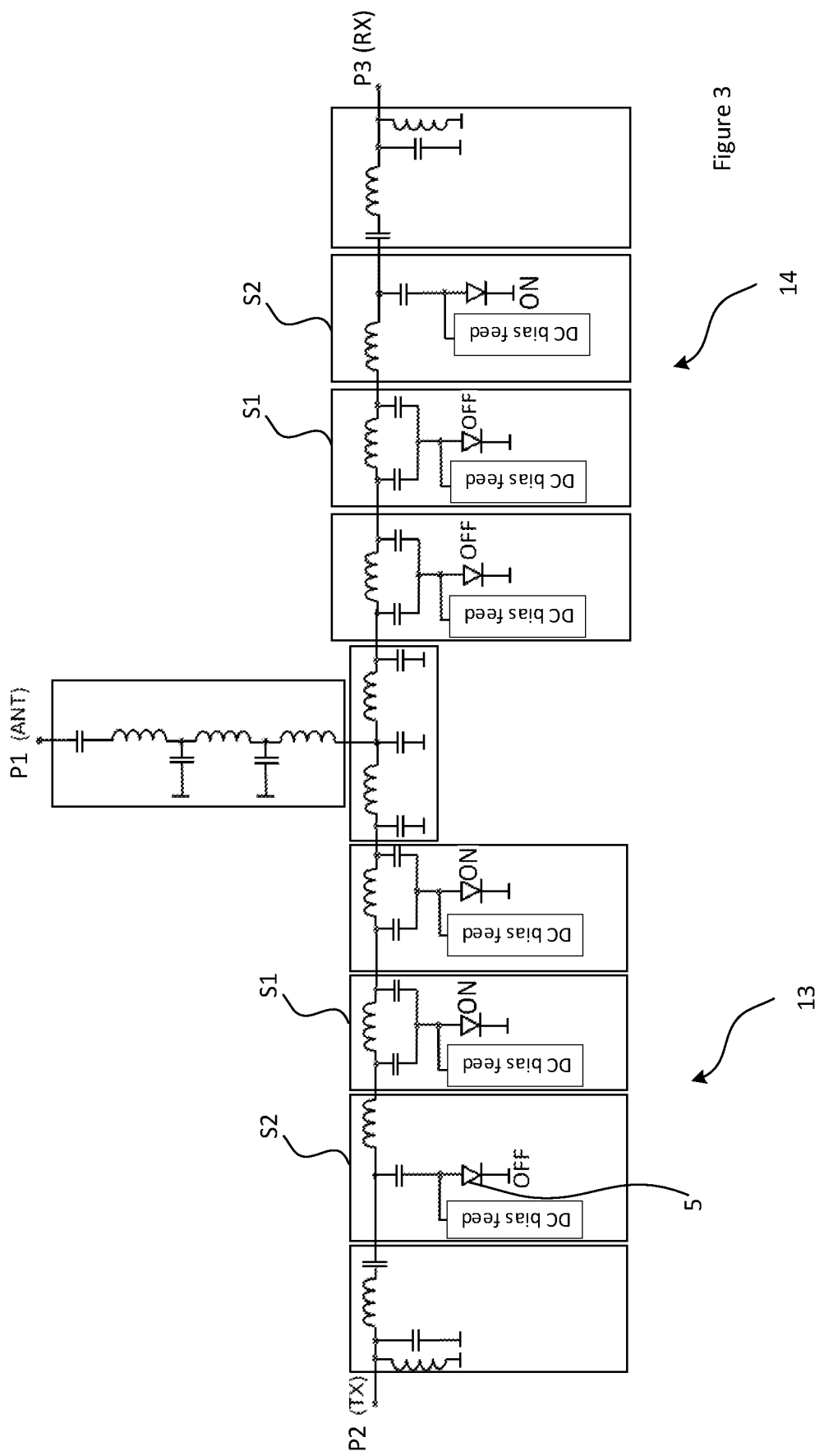
FIG. 3 illustrates an embodiment of the switch topology where each first and the second switching stage each comprises one PIN-diode

FIG. 3 shows an embodiment of the switch topology 1 where each first and the second switching stage S1, S2 each comprises one PIN-diode 5. Thus, in some embodiments the PIN-diodes are not parallel arranged in the switching stages S1, S2 (as they are in S2 of FIG. 2).

Figure 4:
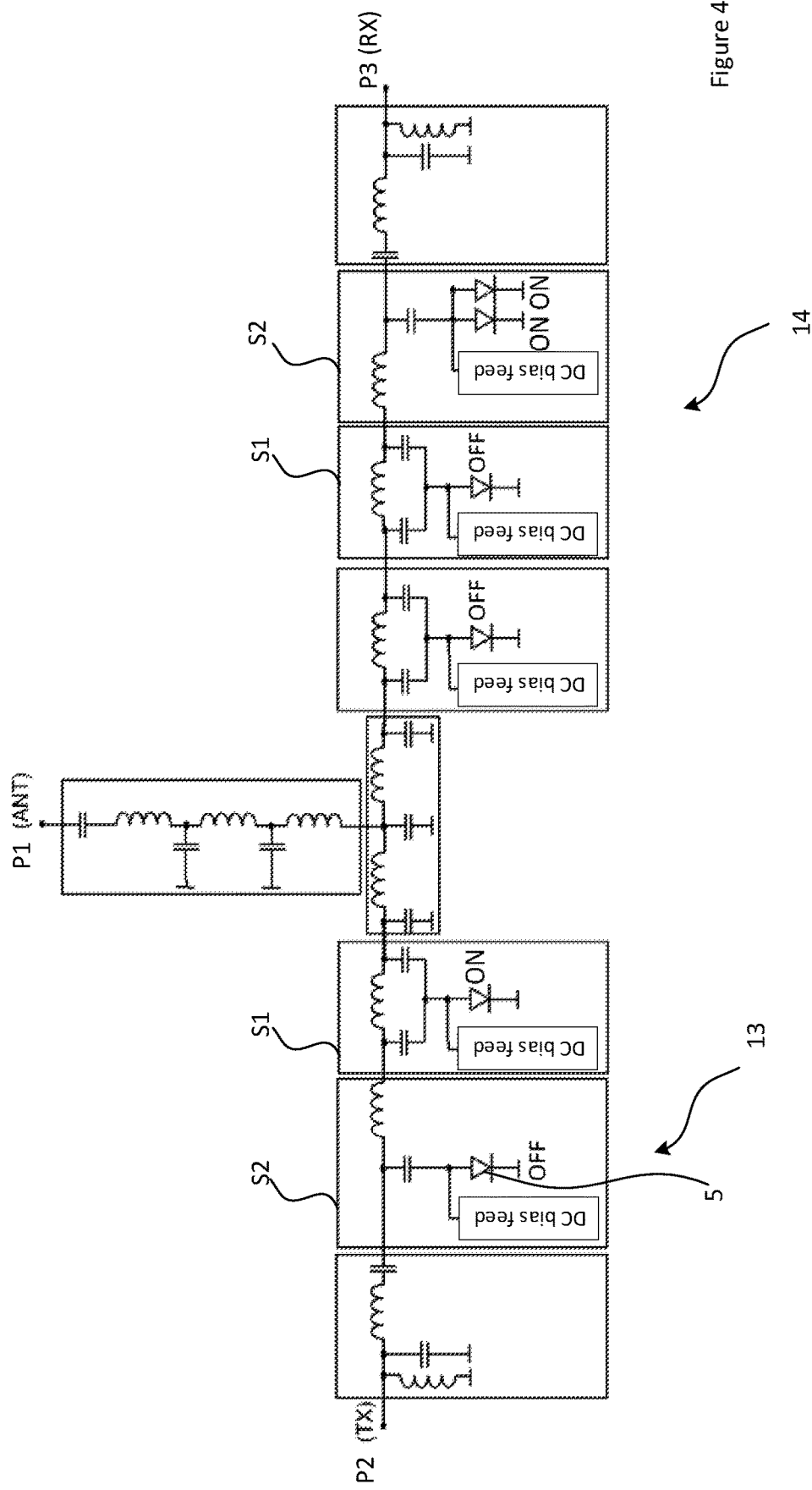
FIG. 4 illustrates an asymmetrical switch topology in accordance with an embodiment of the present disclosure

FIG. 4 shows the switch topology 1 in accordance with an embodiment of the present disclosure where the switch topology 1 is asymmetrically arranged. Accordingly, at least one of the number of first switching stages S1 on the first arm 13 relative to the second arm 14 may be different or the number of second switching stages S2 on the first arm 13 relative to the second arm 14 may be different. In FIG. 4, there are 1 first switching stage S1 on the first arm 13 and two first switching stages S1 on the second arm 14. However, according to some embodiments there may be another amount of switching stages. The switch topology 1 scheme as shown in FIG. 4 may give an improved performance for the P2-P1 path. In FIG. 4, the P2-P1 path is in insertion loss mode and the P1-P3 path is in isolation mode. Further, as seen in FIG. 4, the second switching stage S2 in the first arm 13 comprises only one PIN-diode 5, wherein the second switching stage S2 in the second arm 14 comprises two PIN-diodes 5. Thus, the number of PIN-diodes 5 on the first and second arm 13, 14 may differ.

Figure 5:
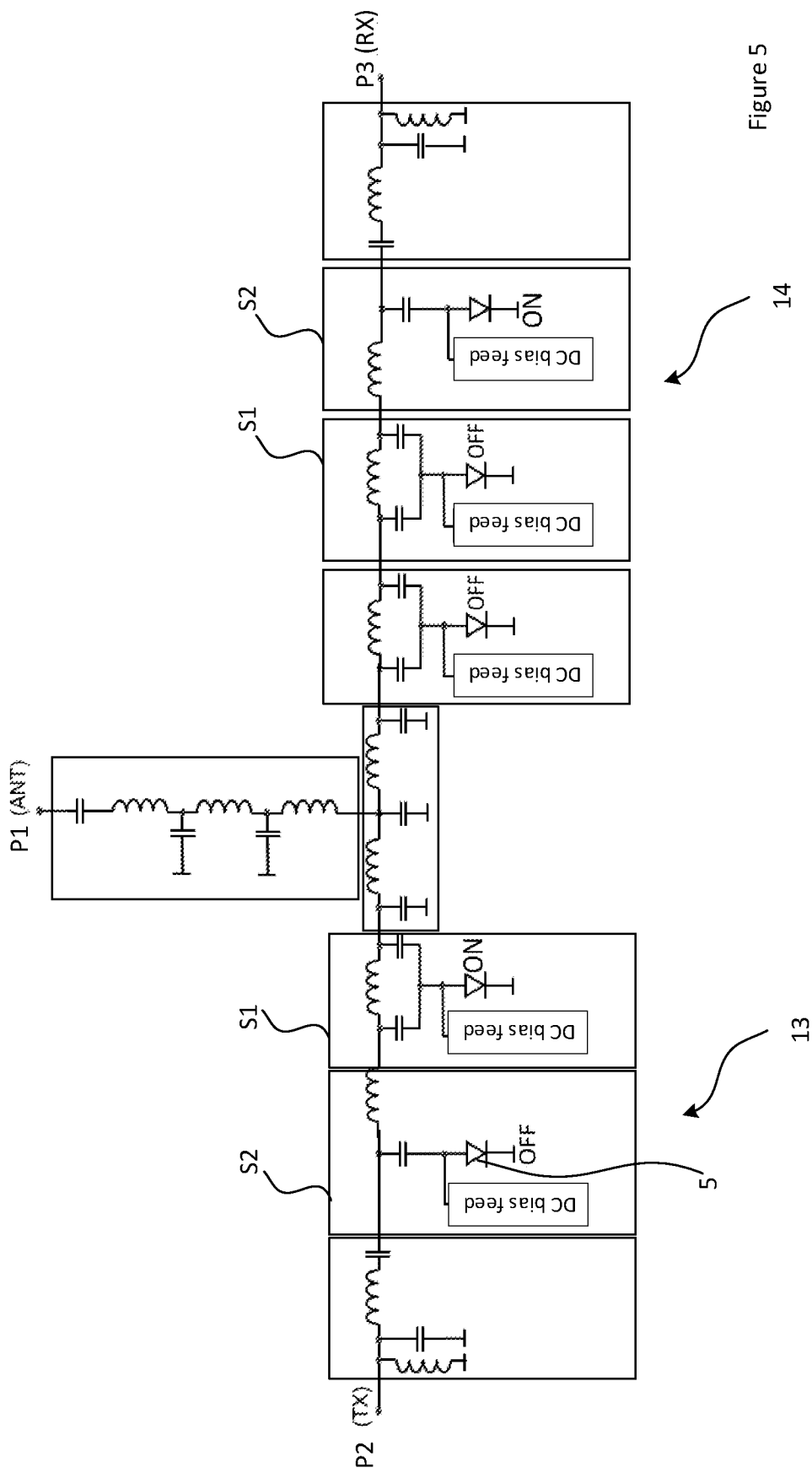
FIG. 5 illustrates an embodiment of the asymmetrical switch topology where each first and the second switching stage each comprises one PIN-diode FIG. 6 Illustrates the schematics of a switch topology disclosing control circuitry and memory devices

FIG. 5 shows an asymmetrical switch topology 1 in accordance with an embodiment of the present disclosure. In FIG. 5, the amount of PIN-diodes 5 are the same on all switching stages S1, S2 on both arms 13, 14.

Figure 6:
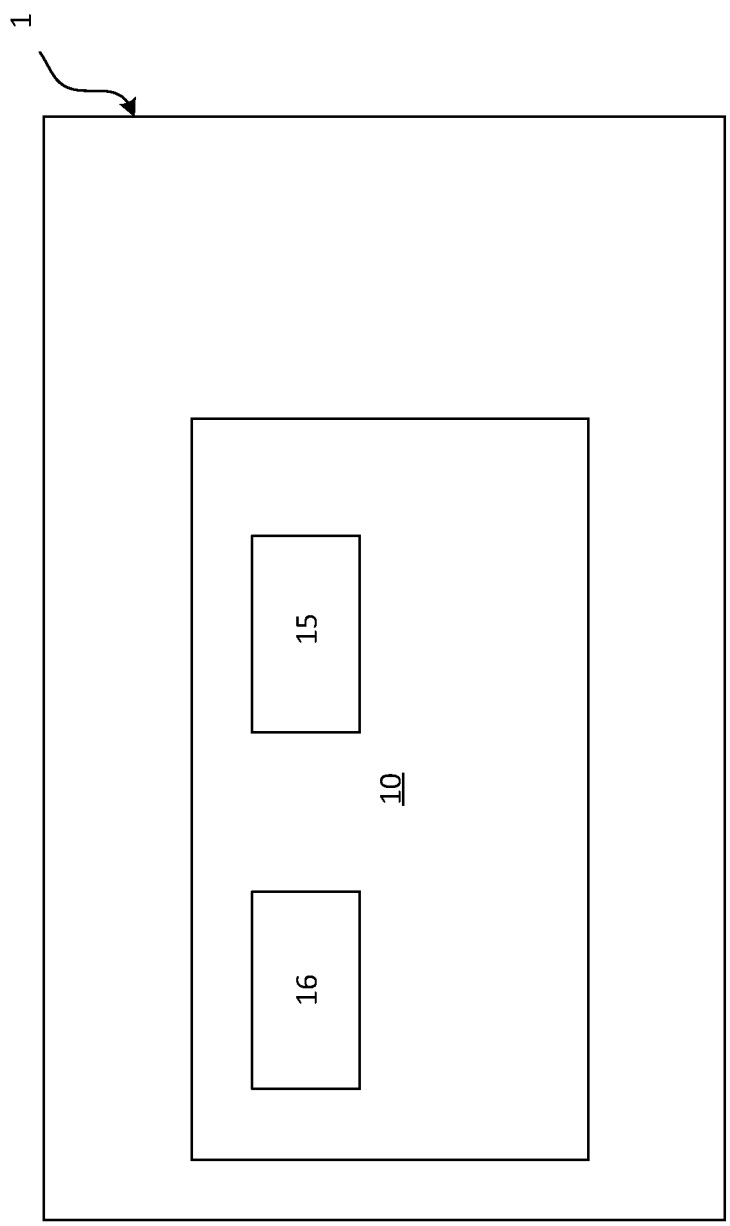

FIG. 6 schematically shows the switch topology 1 according to the present disclosure. As seen in FIG. 6, the switch topology may comprise control circuitry 10 for control of the switch topology 1 as shown in FIG. 6 schematically. The control circuitry and the switch topology 1 may be integrated.

As illustrated in FIG. 6, the control circuitry may comprise one or more memory devices 15. The control circuitry may further comprise a communication interface 16. The memory device 15 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by each associated control circuitry 10. Each memory device 15 may store any suitable instructions, data or information, including a computer program, software, an application including one or more of logic, rules, code, tables, etc. and/or other instructions capable of being executed by the control circuitry 10 and, utilized. For example the control device 10 may execute switching between the first and the second path in the switch topology 1. Memory device 15 may be used to store any calculations made by control circuitry 10 and/or any data received via the communication interface 16. In some embodiments, each control circuitry 10 and each memory device 15 may be considered to be integrated.

Each memory device 15 may also store data that can be retrieved, manipulated, created, or stored by the control circuitry 10. The data may include, for instance, local updates, parameters, training data, learning models and other data. The data can be stored in one or more databases. The one or more databases can be connected to the server by a high bandwidth field area network (FAN) or wide area network (WAN), or can also be connected to server through a communication network.

The control circuitry 10 may include, for example, one or more central processing units (CPUs), dedicated to performing calculations, and/or other processing devices. The memory device 15 can include one or more computer-readable media and can store information accessible by the control circuitry 10, including instructions/programs that can be executed by the control circuitry 10. Thus, the instructions/programs may comprise instructions relating to alternating the switch topology 1 between different paths, the alternation may be based on other information processed by the control circuitry 10 and retrieved by e.g. an antenna.

Figure 7:
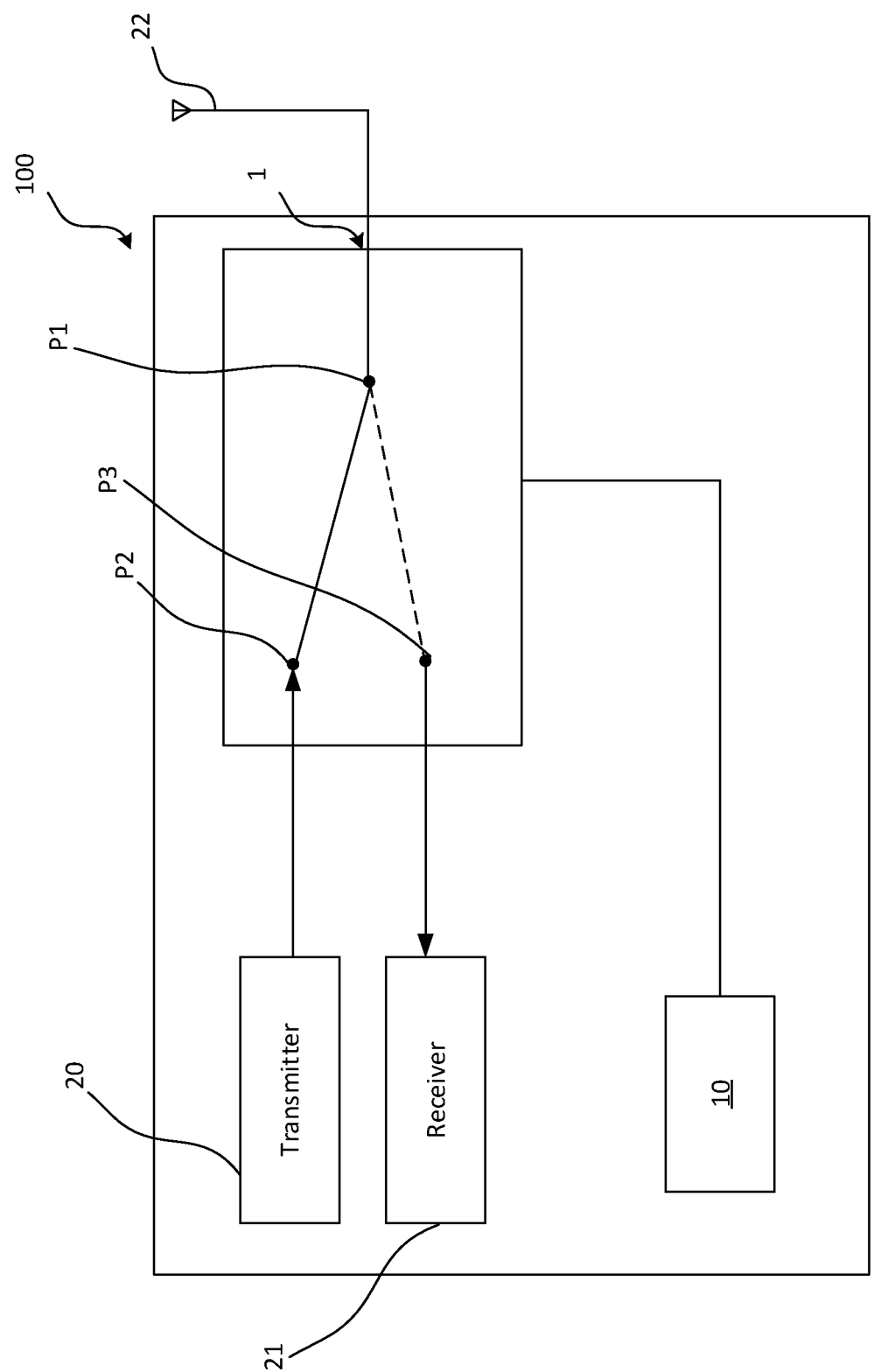
FIG. 7 illustrates an RF system comprising the switch topology in accordance with an embodiment of the present disclosure

FIG. 7 shows an RF system 100 in accordance with an embodiment of the present disclosure, the RF system 100 shown in FIG. 7 is an antenna system comprising a transmitter 20 and a receiver 21 connected to a port P2, P3 respectively. Further, the third port P1 in FIG. 7 is an antenna port which is connected to an antenna 22. The RF system in FIG. 7 is set in a transmitting operating mode. Accordingly, it is set to that the P2-P1 path (the first path) is in insertion loss mode, wherein the P1-P3 path (the second path) is in isolation mode. The RF system 100 with the implemented switch topology 1 may allow for a single antenna 22 to be utilized by both a transmitter 20 and a receiver 21.

The RF system 100 may be implemented in a wireless communication device which may also be referred to as a wireless device, a mobile device, mobile station, subscriber station, client, client station, user equipment (UE), remote station, access terminal, mobile terminal, terminal, user terminal, subscriber unit, etc. Examples of wireless communication devices include laptop or desktop computers, cellular phones, smartphones, wireless modems, e-readers, tablet devices, gaming systems, keyboards, keypads, computer mice, remote controllers, handsets, headsets, headphones, automobile hands-free audio system, etc.

Figure 8:
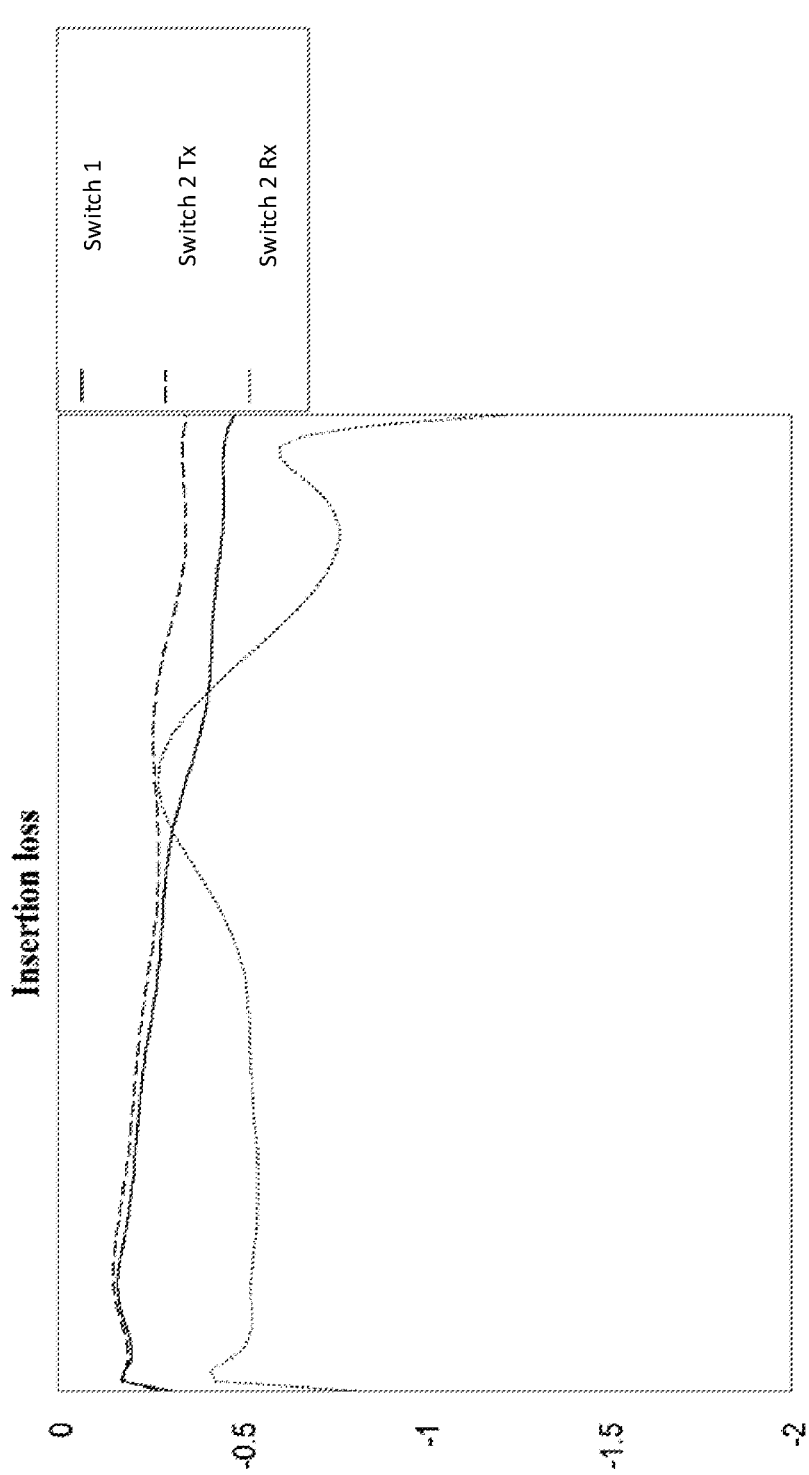
FIG. 8 illustrates a graph disclosing a simulation of insertion loss performance of a symmetrical switch and an asymmetrical switch in accordance with an embodiment of the present disclosure
Figure 9:
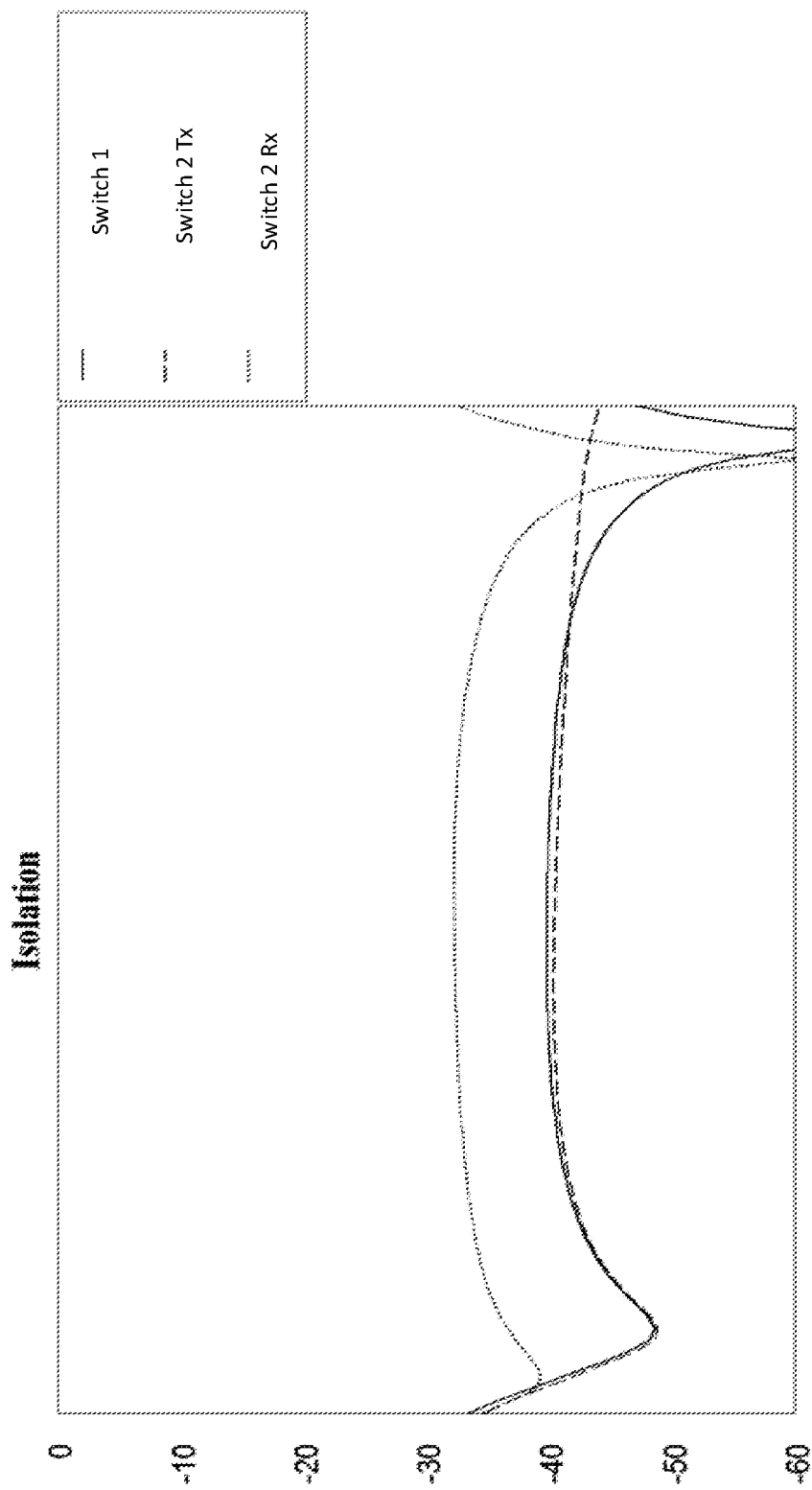
FIG. 9 illustrates a graph disclosing a simulation of isolation performance of a symmetrical switch and an asymmetrical switch in accordance with an embodiment of the present disclosure.
Figure 10:
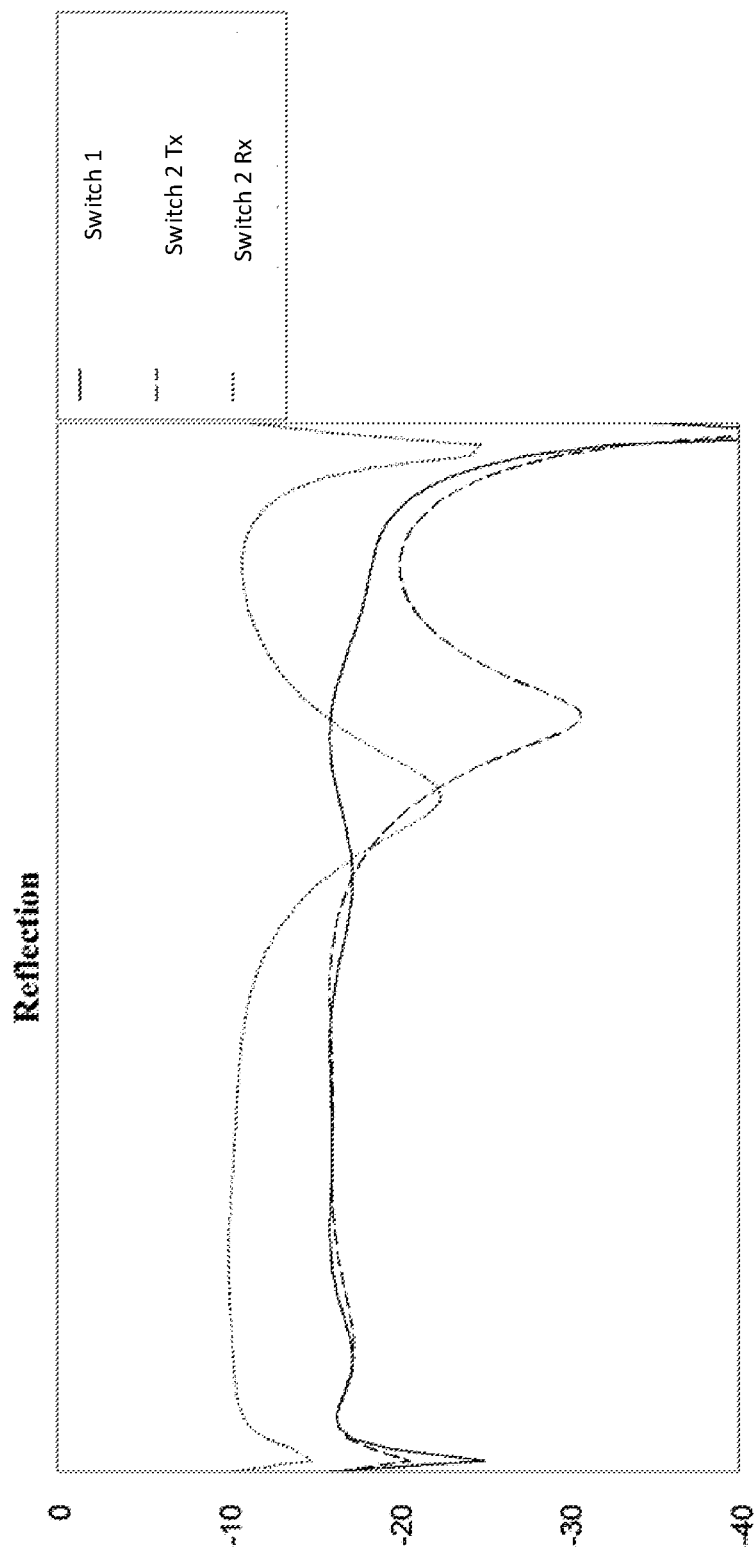
FIG. 10 illustrates a graph disclosing a simulation of reflection performance of a symmetrical switch and an asymmetrical switch in accordance with an embodiment of the present disclosure

The FIGS. 8-10 illustrates graphs to show the performance of the switch topology 1 as disclosed herein. The purpose of the simulations are to further describe the disclosure as presented herein accompanied with advantages thereof. It should be noted that the simulations are based on embodiments for a disclosing purpose, however it is not limited to said embodiments and may be varied within the present disclosure. The FIGS. 8-10 compare the performance of a symmetric switch in accordance to the embodiment shown in FIG. 2, and the first and the second path of an asymmetric switch in accordance with the embodiment shown in FIG. 4. Accordingly, each graph illustrated in the FIGS. 8-10 shows three plots, i.e. a plot depicting performance of the symmetric switch (denoted 'Switch 1' in the graph), a plot depicting performance of the first path of the asymmetric switch (Denoted 'Switch 2 Tx') when it is active, and a plot (Denoted 'Switch 2 Rx') depicting performance of the second path of the asymmetric switch when it is active.

It should be noted that all the FIGS. 8-10 have the same decade bandwidth at the x-axis (although frequency is not explicitly disclosed in the x-axis in the FIGS. 8-10)

FIG. 8 illustrates a graph showing insertion loss performance for the switches. FIG. 8 shows that the first path of the asymmetrical switch shows an improved performance compared to the symmetrical switch. However, an amount of the performance in the second path of the asymmetrical switch is sacrificed to obtain the improvement at the first path. Thus, an asymmetrical switch may in some situations have benefits e.g. when a specific path is to be emphasized in the switch 1.

FIG. 9 illustrates a graph showing isolation performance for the switches, where there is illustrated that the 'Switch 1' and 'Switch 2 Tx' has a 40 dB isolation over 160% bandwidth.

FIG. 10 illustrates reflection performance of the two switches. As illustrated in FIG. 10, the switch topology 1 according to the embodiment in FIG. 2 (Switch 1) shows a −16 dB reflection over a decade bandwidth. This is also the case for 'Switch 2 Tx'.

Based on the FIGS. 8-10 it is shown that the symmetrical switch and the asymmetrical switch in accordance with the embodiments herein perform well in terms of isolation, insertion loss and reflection. Further, the proposed switches will also be able to handle high power levels which e.g. switches with series PIN-diodes can't handle. Thus, the switch topology 1 in accordance with the present disclosure provides for excellent performance in high-power and decade wide bandwidth applications.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be at least in part implemented by means of both hardware and software, and that several "means" or "units" may be represented by the same item of hardware.

The invention claimed is:

1. A single-pole double-throw (SPDT) radio-frequency; (RF) switch topology comprising:
    a first port, a second port, and a third port;
    a first switchable path arranged between the first port and the second port;
    a second switchable path arranged between the first port and the third port;
    wherein the first switchable path comprises at least one first switching stage and at least one second switching stage;
    wherein the second switchable path comprises at least one first switching stage and at least one second switching stage;
    wherein each first switching stage comprises a first impedance network having a line inductance element, and two shunt capacitors, each first switching stage further comprising at least one shunt PIN diode and a bias feed for applying a bias voltage to the at least one shunt PIN diode, wherein the two shunt capacitors of each first switching stage are grounded via the at least one shunt PIN diode;
    wherein each second switching stage comprises a second impedance network having a line inductance element and a shunt capacitor, each second switching stage further comprising at least one shunt PIN diode and a bias feed for applying a bias voltage to the at least one shunt PIN diode, wherein the shunt capacitor of each second switching stage is grounded via the at least one shunt PIN diode; and
    a control circuitry configured to:
    control each bias feed of each first switching stage and each second switching stage so to selectively alternate the first and the second switchable paths between a first operating mode and a second operating mode.

2. The SPDT RF switch topology according to claim 1, wherein the first operating mode is an isolation mode, and the second operating mode is an insertion loss mode, wherein the control circuitry is configured to control each bias feed so to form an active signal path in insertion loss mode, and an inactive signal path in isolation mode.

3. The SPDT RF switch topology according to claim 1, wherein the second switching stages of the first and second switchable paths are arranged closer to the second and third ports, respectively, as compared to the first switching stages of the first and second switchable paths.

4. The SPDT RF switch topology according to claim 1, wherein the first port is an antenna port, the second port is a transmit port, and the third port is a receive port.

5. The SPDT RF switch topology according to claim 4, wherein the first switchable path is a transmit path and the second switchable path is a receive path, wherein the control circuitry is configured to selectively connect the antenna port to either the transmit port or the receive port by means of controlling each bias feed so to alternate between a transmitting operating mode and a receiving operating mode.

6. The SPDT RF switch topology according to claim 1, wherein the first and the second switchable path each comprises matching networks, each matching network comprising at least one shunt capacitor, and at least one line inductance element.

7. The SPDT RF switch topology according to claim 1, wherein the PIN diodes of each switching stage comprise an ON-state and an OFF-state, wherein the control circuitry is configured to control the bias feed so to set the PIN diodes in the first switching stage on the first switchable path in a different state relative to the PIN diodes in the first switching stage on the second switchable path.

8. The SPDT RF switch topology according to claim 1, wherein the PIN diodes of each switching stage comprise at least an ON-state and an OFF-state, wherein the control circuitry is configured to control the bias feed so to set the PIN diodes in the second switching stage on the first switchable path in a different state relative to the PIN diodes in the second switching stage on the second switchable path.

9. The SPDT RF switch topology according to claim 1, wherein the switch topology comprises an intermediate node, wherein the first switchable path extends in-between the first port, the intermediate node and the second port, forming a first arm in-between the second port and the intermediate node, wherein the second switchable path extends in-between the first port, the intermediate node and the third port, forming a second arm in-between the intermediate node and the third port, wherein at least one of the arms comprises at least one first switching stages.

10. The SPDT RF switch topology according to claim 9, wherein the switch topology is asymmetrically arranged, wherein at least one of:

the number of first switching stages on the first arm relative to the second arm are different; or the number of second switching stages on the first arm relative to the second arm are different.

11. A radio frequency (RF) system comprising:
a single-pole double-throw (SPDT) radio frequency switch topology, wherein the SPDT RF switch topology comprises:
a first port, a second port, and a third port;
a first switchable path is arranged between the first port and the second port;
a second switchable path is arranged between the first port and the third port;
  wherein the first switchable path comprises at least one first switching stage and at least one second switching stage;
  wherein the second switchable path comprises at least one first switching stage and at least one second switching stage;
  wherein each first switching stage comprises a first impedance network having a line inductance element, and two shunt capacitors, each first switching stage further comprising at least one shunt PIN diode and a bias feed for applying a bias voltage to the at least one shunt PIN diode, wherein the two shunt capacitors of each first switching stage are grounded via the at least one shunt PIN diode;
  wherein each second switching stage comprises a second impedance network having a line inductance element and a shunt capacitor, each second switching stage further comprising at least one shunt PIN diode and a bias feed for applying a bias voltage to the at least one shunt PIN diode, wherein the shunt capacitor of each second switching stage is grounded via the at least one shunt PIN diode; and
a control circuitry configured to:
  control each bias feed of each first switching stage and each second switching stage so to selectively alternate the first and the second switchable paths between a first operating mode and a second operating mode.

* * * * *